United States Patent [19]

Little et al.

[11] Patent Number: 4,684,832
[45] Date of Patent: Aug. 4, 1987

[54] ANALOG CIRCUIT IMPROVEMENT IN A DIGITAL INTEGRATED CIRCUIT TECHNOLOGY

[75] Inventors: Thomas N. Little, Kanata; Lorenzo L. Longo, Nepean; Sun-Shiu D. Chan, Kanata, all of Canada

[73] Assignee: Northern Telecom Limited, Montreal, Canada

[21] Appl. No.: 857,222

[22] Filed: Apr. 29, 1986

[51] Int. Cl.⁴ .......................... H03K 5/00; H03F 3/04
[52] U.S. Cl. .................................. 307/520; 330/303; 330/306
[58] Field of Search ............... 330/107, 109, 294, 306, 330/303; 307/520; 328/167; 333/172, 176

[56] References Cited

U.S. PATENT DOCUMENTS 3,204,192  8/1965  Barditch et al. ................ 330/107 X
3,621,407  11/1971  Kerwin et al. ............... 330/109 UX Primary Examiner—James B. Mullins
Attorney, Agent, or Firm—J. E. Moorhouse

[57] ABSTRACT

A CMOS integrated filter includes a passive network of resistive and capacitive paired elements and a first differential amplifier, for implementing a second order low pass filter function. A second amplifier is connected in voltage following configuration at an input of the first amplifier. A filter output is provided by an output of the second amplifier.

2 Claims, 5 Drawing Figures

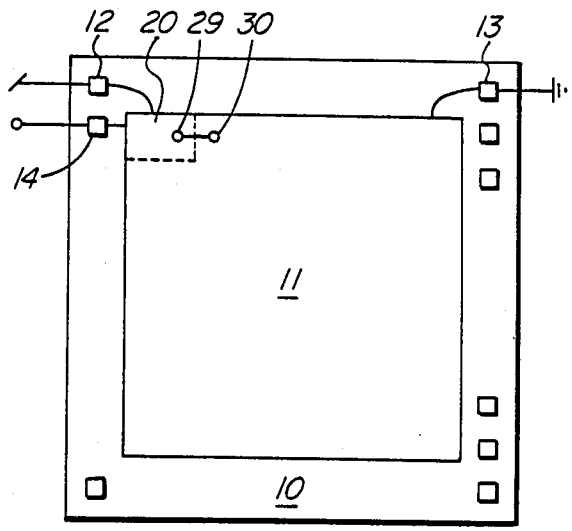
FIG. 1
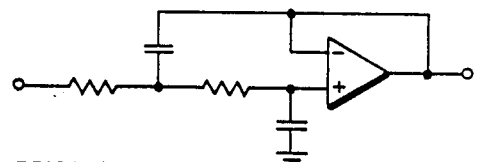
PRIOR ART FIG. 2
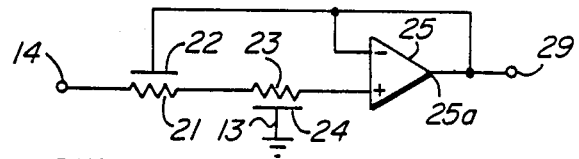
PRIOR ART FIG. 3
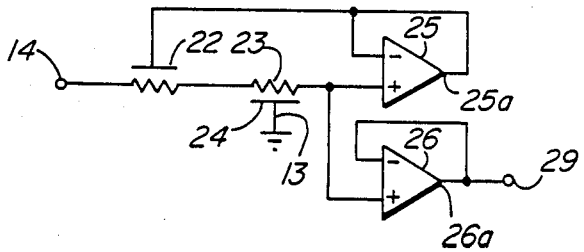
FIG. 4

ANALOG CIRCUIT IMPROVEMENT IN A DIGITAL INTEGRATED CIRCUIT TECHNOLOGY

FIELD OF THE INVENTION

The invention is in the field of analog filter circuits and more particularly relates to a filter circuit within an integrated circuit structure.

BACKGROUND OF THE INVENTION

Production of electronic circuits, in the form of very large scale integrated (VLSI) circuits, has recently become common place. A typical VLSI circuit is usually of the digital circuit type, and of such complexity that may be more appropriately referred to as a system. However, in some circumstances a complete practical system is not attainable in a single VLSI circuit of the digital circuit type, because of a requirement to interface with external analog signals. Such an interface requirement is usually provided by an analog-to-digital conversion circuit or by a digital-to-analog conversion circuit as the case requires. It is usual that some analog circuitry is required for coupling between analog signal ports and the conversion circuitry.

Among various VLSI manufacturing technologies, those well suited for producing digital VLSI circuit elements are not well suited to providing analog circuit elements. For example the operating characteristics of an analog filter circuit are determined by circuit component values such as resistance and reactance. However, in a VLSI digital optimized technology, such as a complementary metal oxide semiconductor (CMOS) technology, the values of resistive and capactive circuit elements are not nearly as precisely obtainable as with discretely manufactured or selectively trimmed components. Furthermore active analog elements such as differential amplifiers and the like, provided by this technology, have characteristics which are inferior as compared with typical off-the-shelf active analog components.

In spite of these difficulties analog signal circuits have been provided in CMOS technology VLSI circuits, albeit with compromised but tolerable functionality. This has been achieved by a filter design which is optimized to be as insensitive as possible to processing and temperature variation. In this design, distributed rather than lumped capacitive elements are used. The distributed capacitive element is formed along a resistive path of an associated resistive element to provide a resistor capacitor pair configuration. A conductive electrode provides a plate of the capacitor and carries a dielectric layer between it and a polycrystalline silicon layer which is tailored to provide the resistor element. This produces a distributed capacitive effect and reduces stray capacitance effects between the resistor element and the substrate of the VLSI circuit. The product of the R and C values of the pair configuration remains somewhat stable in spite of undesirable process variations. For example if an over etch variation occurs a thinner resistor element is produced having an increased resistance value. At the same time however, the capacitance coupling at the conductive electrode is decreased. Since the pole frequency of the filter is determined by the RC products of the pair configuration, the process variation tends to be of little consequence as compared to a circuit with independent capacitor and resistor elements.

In one example, a simple network of paired resistive and capacitive elements is connected with a differential amplifier to provide a second order low pass filter for analog signals entering a VLSI circuit. Such a filter exhibits all the required low passband filter characteristics except for higher frequencies which are about an octave or more removed from the passband. Signals of such frequencies tend to traverse the analog filter with less than desirable attenuation and tend to have a deleterious effect upon any subsequent analog-to-digital conversion function.

SUMMARY OF THE INVENTION

It is an object of the invention to achieve an improved analog filter circuit function in a digital integrated circuit, without requiring any additional processing step in the manufacture of the integrated circuit.

In accordance with the invention a filter for analog signals includes a filter input electrode, a filter output electrode, a first amplifier having an input and an output, and a network of passive elements including a resistive element and a capacitive element. The nework is connected between the filter input electrode and the input and the output of the first amplifier. A second amplifier includes an input connected to a junction between the input of the first amplifier and the network. The second amplifier also includes an output connected to the filter output electrode.

In one example of the invention an analog filter has a filter input electrode and resides in a CMOS integrated circuit chip. The filter input electrode is pinned out of the chip for receiving an analog signal. The filter includes a filter output electrode for providing a filtered analog signal for use in the chip. In the filter a first amplifier being a differential amplifier has an output and inverting and non-inverting inputs. A first resistive capacitive element and a second resistive capacitive element are connected in series between the filter input electrode and the non-inverting input, to provide a resistive path therebetween. A capacitive electrode of the first resistive capacitive element is connected to the output and the inverting input. A capacitive electrode of the second resistive capacitive element is connected to ground. A second amplifier is connected between the non-inverting input of the first amplifier and the filter output electrode so that the output of the second amplifier provides the filtered analog signal at the output electrode.

BRIEF DESCRIPTION OF THE DRAWINGS

An example embodiment is described with reference to the accompanying drawings in which:

FIG. 1 is a block drawing of an example geography of an integrated circuit chip in which a circuit in accordance with the invention is useful;

FIG. 2 is a schematic diagram of a known low pass filter circuit;

FIG. 3 is a schematic diagram of the filter circuit in FIG. 2 as it is normally adapted for integration in the chip in FIG. 1;

FIG. 4 is a schematic diagram of a low pass filter circuit similar to FIG. 3 but which is improved in accordance with the invention.

DETAILED DESCRIPTION

Figure 5:
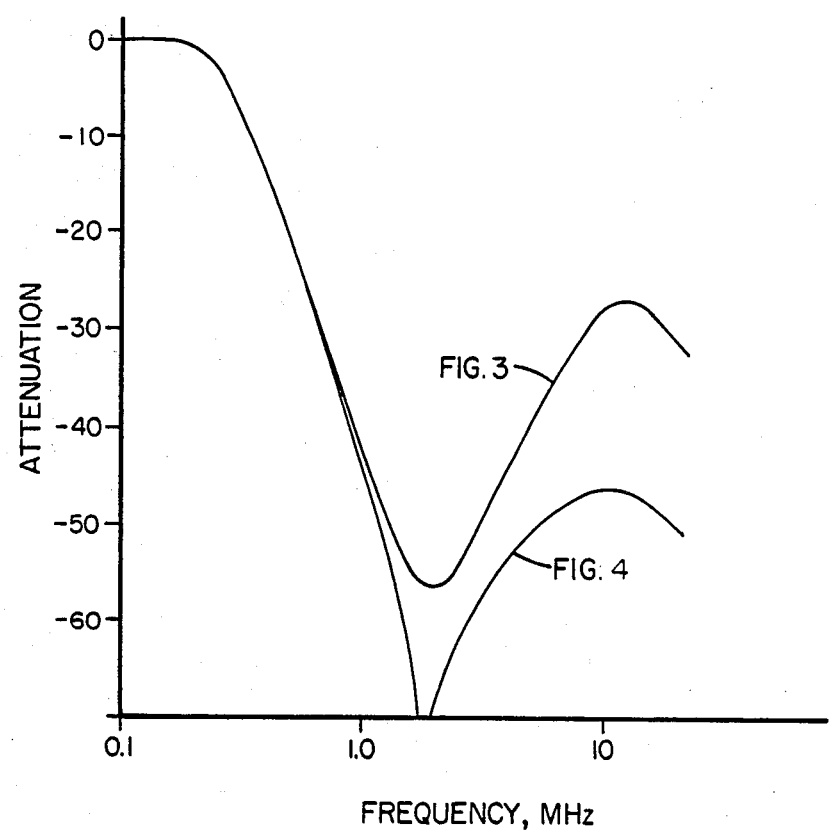
FIG. 5 is a graphical illustration of operating characteristics of the filter circuits in the FIGS. 3 and 4.

FIG. 1 shows a typical application of the invention. A carrier 10 supports an integrated circuit chip 11, a portion of which includes an analog circuit 20. The analog circuit 20 includes an output 29 connected to a port 30 of a converter circuit, not shown, in the integrated circuit 11. Power, ground and analog signal connection pads 12, 13 and 14 are supported by the carrier along with other connection pads and provide for connections with the chip 11.

A well known form of a prior art second order low pass filter circuit is illustrated in FIG. 2. If the filter circuit in FIG. 2 is to be integrated in a circuit structure which is produced by a process optimized for digital circuit functions, a structure similar to that of FIG. 2, but altered as represented in FIG. 3 is usually used. In FIG. 3, resistive and capacitive elements, for example 21, 22 are paired by means of a structure which includes the resistive element being of a finite length and the capacitive element being an electrode lying along the length of the resistor and separated therefrom by a dielectric. This is a well known structure in complementary metal oxide semiconductor (CMOS) technology, and although the actual values of resistor and capacitor elements are not precisely predictable, it is well known that the products of values of resistive capacitive pairs are sufficiently predictable to be practically useful. The low pass filters in FIGS. 3 and 4 are the same insofar as each includes resistive capacitive paired elements 21, 22 and 23, 24. In each filter, the resistance elements 21 and 23 are connected in series between the analog signal input 14 and a non-inverting input of a CMOS implemented differential amplifier 25. An output 25a of the differential amplifier 25 is connected to an inverting input of the differential amplifier 25 and to an electrode of the capacitive element 22. The electrode of the capacitive element 24 is connected to ground. The filter circuits differ in that in the prior art circuit of FIG. 3, the output 29 of the filter circuit is provided from the output 25a of the differential amplifier. This is as would be expected and is similar to the form shown in FIG. 2. In the filter circuit in FIG. 4 a differential amplifier 26 includes an output 26a which is connected to the filter output 29. The differential amplifier 26 is connected in voltage follower configuration as shown, such that in operation the output 29 provides a low impedance source which follows the analog signal at a junction 27.

Operation of the circuits in both FIGS. 3 and 4 is essentially indistinguishable through the passband illustrated in FIG. 5. However, in the case of FIG. 3 at higher frequencies, in a stop band shown in FIG. 5, attenuation of the analog signal is insufficient. The insufficient attenuation is believed to be a result of unavoidable capacitive coupling between the input 14 and the output 29 via the capacitive electrode 22. At lower frequencies, the coupling is correspondingly less, and the effective output impedance of the amplifier 25 is low. At higher frequencies the gain of the amplifier is reduced and the impedance at the output of the CMOS implemented amplifier 25 is not as low. Hence, in a stop band range of frequencies the filter input and output are in essence capacitively coupled.

In the case of FIG. 4, at higher frequencies, the operation is essentially the same as in the case of FIG. 3, except for the fact that the filter output 29 is taken from the output 26a of the differential amplifier 26. Thus in operation at frequencies in the stop band even though the second order filter operation is in essence unavailable, the filter continues to operate substantially as a buffered first order filter. In contrast to the stop band operation of the prior art filter in FIG. 3, the filter in FIG. 4 therefore provides substantially greater attenuation. In many applications this improved functionality renders the inclusion of analog circuitry within CMOS integrated circuitry a practical and cost effective reality.

FIG. 5 illustrates improved attenuation characteristics of the filter of FIG. 4 as compared to the filter of FIG. 3. In FIG. 5, the vertical axis of the graph is scaled in decibels and the horizontal axis represents frequency. In the operation of the improved filter, a transition from second order function to first order function begin around a frequency of 1 MHz. This is a frequency above which the output 25a of the differential amplifier 25 no longer closely follows the signal voltage at the non-inverting input. Thus by buffering the voltage at the non-inverting input by means of the amplifier 26, a ten to twenty decibel improvement in attenuation above 1 MHz was obtained as is shown in FIG. 5.

What is claimed is:

1. A filter, for analog signals, comprising:
   a filter input electrode, for receiving an analog signal;
   a filter output electrode, for providing a filtered analog signal;
   a first amplifier being a differential amplifier and having an output and inverting and non-inverting inputs;
   a first resistive capacitive element and a second resistive capacitive element being connected in series between the filter input electrode and the non-inverting input to provide a resistive path therebetween, a capacitance electrode of the first resistive capacitive element being connected to the output and the inverting input, and a capacitance electrode of the second resistive capacitive element being connected to ground; and
   a second amplifier being connected in voltage follower configuration between the non-inverting input of the first amplifier and the filter output electrode, for providing the filterd analog signal at the filter output electrode.

2. In a CMOS integrated circuit, power and ground electrodes for connection across a source of power, an active filter circuit and a digital circuit means, the active filter circuit comprising:
   input and output electrodes, the output electrode being connected to the digital circuit means;
   a first differential amplifier having an output and inverting and non-inverting inputs;
   a first resistive capacitive element and a second resistive capacitive element being connected in series between the input electrode and the non-inverting input, to provide a resistive path therebetween, a capacitance electrode of the first resistive capacitive element being connected to the output and to the inverting input, and a capacitance electrode of the second resistive capacitive element being connected to the ground electrode; and
   a second differential amplifier including an output and an inverting input being connected together to said output electrode, and a non-inverting input being connected to a junction of the second resistive capacitive element and the non-inverting input of the first differential amplifier.

* * * * *